(12) United States Patent
Chen et al.

(10) Patent No.: US 10,809,605 B2
(45) Date of Patent: Oct. 20, 2020

(54) OPTICAL PROJECTION SCREEN AND MANAGEMENT SYSTEM THEREOF

(71) Applicant: Xiamen RIBEEN Electronic Technology Co., Ltd, Xiamen, Fujian (CN)

(72) Inventors: Zhanhan Chen, Fujian (CN); Qingjun Li, Fujian (CN)

(73) Assignee: XIAMEN RIBEEN ELECTRONIC TECHNOLOGY CO., LTD., Fujian (CN)

( * ) Notice: Subject to any disclaimer, the term of this patent is extended or adjusted under 35 U.S.C. 154(b) by 197 days.

(21) Appl. No.: 16/179,481

(22) Filed: Nov. 2, 2018

(65) Prior Publication Data

US 2020/0081330 A1    Mar. 12, 2020

(30) Foreign Application Priority Data

Sep. 12, 2018  (CN) .......................... 2018 1 1062473

(51) Int. Cl.
*G03B 21/16* (2006.01)
*G03B 21/20* (2006.01)
*G08B 21/18* (2006.01)
*G03B 21/60* (2014.01)

(52) U.S. Cl.
CPC .......... *G03B 21/16* (2013.01); *G03B 21/2033* (2013.01); *G03B 21/60* (2013.01); *G08B 21/182* (2013.01)

(58) Field of Classification Search
CPC ..... G03B 21/16; G03B 21/2033; G03B 21/60; G08B 21/182
See application file for complete search history.

(56) References Cited

U.S. PATENT DOCUMENTS

2010/0245720 A1*  9/2010  Moriya ............. G02F 1/133603
349/70

* cited by examiner

*Primary Examiner* — Michelle M Iacoletti
*Assistant Examiner* — Danell L Owens
(74) *Attorney, Agent, or Firm* — Muncy, Geissler, Olds & Lowe, P.C.

(57) ABSTRACT

An optical projection screen and a management system thereof are provided. The optical projection screen comprises an LED display module, a cooling module and an optical projection curtain. The optical projection curtain adheres to the LED display module with optical UV glue and is disposed on the light-emitting side of the LED display module. The cooling module is disposed on the backlight side of the LED display module and comprises a plurality of cooling assemblies distributed in different areas and used for cooling different areas of the LED display module. Each cooling assembly comprises a semiconductor refrigeration module, a temperature sensor and an intelligent switch. The intelligent switches control on-off of the semiconductor refrigeration modules according to the temperature detected by the temperature sensors. Multiple modules can be spliced to achieve large-screen display.

9 Claims, 9 Drawing Sheets

OPTICAL PROJECTION SCREEN AND MANAGEMENT SYSTEM THEREOF

BACKGROUND OF THE INVENTION

Technical Field

The invention relates to the technical field of LED projection, in particular to an optical projection screen and a management system thereof.

Description of Related Art

In recent years, the small-pitch LED screen display technology has been rapidly developed and widely applied to various fields. The quantities of heat generated by different modules of small-pitch LED display screens are different due to different contents displayed by the LED display screens. However, due to the fact that a passive cooling method based on cooling fins disposed behind the modules and adopted by all products on the market right now cannot accurately handle the heat conditions of all the modules, dead pixels frequently occur after the modules are used for a certain period of time, and different degrees of aging of the modules result in chromatic aberration. The cooling defect has become one of the main hindrances for further reduction of the pixel pitches of the small-pitch LED display screens. The high brightness, which is generally over 500 $CD/M^2$, of the small-pitch LED display screens has obviously exceeded the comfort degree of people, and color and grayscale losses will be caused when the brightness of the small-pitch LED display screens is reduced from the drive ends. Meanwhile, due to the large blue-light radiation of the small-pitch LED display screens, severe harm to human bodies will be caused when people watch too close to such screens.

BRIEF SUMMARY OF THE INVENTION

The objective of the invention is to solve the above-mentioned problems by providing an optical projection screen and a management system thereof. The optical projection screen uses LEDs as a display light source, adopts an active intelligent cooling technology, is provided with an optical projection curtain in front of the LEDs and can realize large-screen display through multiple modules spliced together, the operating temperature is made more stable and uniform, the dead pixel rate and the failure rate are decreased, a displayed picture is soft in light and adjustable in brightness, and thus, the optical projection screen is suitable for being used in a close range for a long time.

The detailed scheme is as follows:

An optical projection screen comprises an LED display module, a cooling module and an optical projection curtain. The optical projection curtain adheres to the LED display module with optical UV glue and is disposed on the light-emitting side of the LED display module. The cooling module is fixedly disposed on the backlight side of the LED display module.

The cooling module comprises a plurality of cooling assemblies which are used for cooling different areas of the LED display module. Each cooling assembly comprises a semiconductor refrigeration module, a temperature sensor and an intelligent switch. The intelligent switches are electrically connected with the temperature sensors and the semiconductor refrigeration modules. The semiconductor refrigeration modules are used for cooling the LED display module. The temperature sensors are used for detecting the temperature of the LED display module. The intelligent switches control on-off of the semiconductor refrigeration modules according to the temperature detected by the temperature sensors.

The optical projection curtain is formed by a substrate, a grating structure layer, a dark particle coating, a light-scattering particle layer and an exterior imaging layer which are superposed in sequence. The substrate is a high-transmittance plate. The grating structure layer comprises a plurality of grating units. The dark particle coating is formed by coating the grating structure layer with black photosensitive factors. The light-scattering particle layer comprises a light-transmitting material, light-scattering particles disposed inside the light-transmitting material and a film filter disposed on the light-transmitting material and used to filter out a detrimental waveband. Diffuse reflection structures are disposed on a side, away from the dark particle coating, of the exterior imaging layer.

Furthermore, the LED display module is formed by LEDs arrayed at equal intervals. The distances between every two LEDs are equal. The distance between the optical projection curtain and the LED display module is equal to the distance between two LEDs in the LED display module.

Furthermore, the dark particle coating has a thickness of 0.4-0.6 mm.

Furthermore, the cooling assemblies are arrayed in a matrix manner.

Furthermore, the detrimental waveband ranges from 400 nm to 450 nm.

Furthermore, each grating unit is in a sawtooth shape.

Furthermore, each intelligent switch comprises a control unit and a first data transmission unit. The control units are electrically connected with the temperature sensors, the semiconductor refrigeration modules and the first data transmission units. The temperature sensors transmit acquired temperature data to the control units. The control units control on-off of the semiconductor refrigeration modules according to the temperature and transmit or receive data via the first data transmission units.

An optical projection screen management system is based on the optical projection screen and further comprises a remote management module. The remote management module comprises a remote control unit, a temperature display unit, an alarm unit, a parameter modification unit and a second data transmission unit. The remote control unit is electrically connected with the temperature display unit, the alarm unit, the parameter modification unit and the second data transmission unit and receives temperature data via the second data transmission unit. After receiving temperature data, the remote control unit makes a judgment on the temperature data, transmits the temperature data to the temperature display unit for displaying at the same time, and outputs an alarm signal to the alarm unit when the temperature data are greater than a temperature threshold. The alarm unit sends out an alarm prompt after receiving the alarm signal. The parameter modification unit receives temperature threshold data input by users and then transmits the temperature threshold data to the remote control unit. The remote control unit transmits the temperature threshold data to the control units of all the intelligent switches via the second data transmission unit. The control units modify the temperature threshold according to the received temperature threshold data.

Furthermore, the temperature display unit comprises display blocks in one-to-one correspondence with the cooling assemblies in position. Each display block displays the temperature data transmitted to the remote control unit by the intelligent switch in the corresponding cooling assembly.

By adoption of the above technical scheme, the invention has the following beneficial effects:

(1) The operating temperatures of all spliced modules of a large screen can be kept balanced by independently controlling the temperatures of all areas in the LED display modules, and accordingly, the occurrence rate of dead pixels is greatly decreased.

(2) Blue-light hazards of the LED display screens can be eliminated through micro-pitch optical projection, the brightness of the large screen can be reduced into a range beneficial to human eyes without impairing the grayscale and color of pictures, the long-existing grainy sense of pixels of the LED display screens is eliminated, and thus, the picture pixels are softer and more consecutive.

(3) The optical projection screen is compatible with LED display modules of various pixel specifications, and required large screens with any sizes can be obtained by splicing multiple LED display modules together.

DETAILED DESCRIPTION OF THE INVENTION

Drawings are provided for a further description of embodiments of the invention. These drawings are one part of the contents disclosed by the invention and are mainly intended to illustrate the embodiments and to explain the operation principle of the embodiments with reference to relevant contents in the specification. By referring to these contents, those ordinarily skilled in this field should be able to understand other possible embodiments and advantages of the invention.

The invention is further described as follows in combination with the accompanying drawings and specific embodiments.

Embodiment 1

As shown in FIGS. 1-4, the first embodiment of the invention provides an optical projection screen. The optical projection screen comprises an LED display module 1, a cooling module and an optical projection curtain 3. The optical projection curtain 3 adheres to the LED display module 1 with optical UV glue 2 and is disposed on the light-emitting side of the LED display module 1. The cooling module is fixedly disposed on the backlight side of the LED display module 1.

Figure 4A:
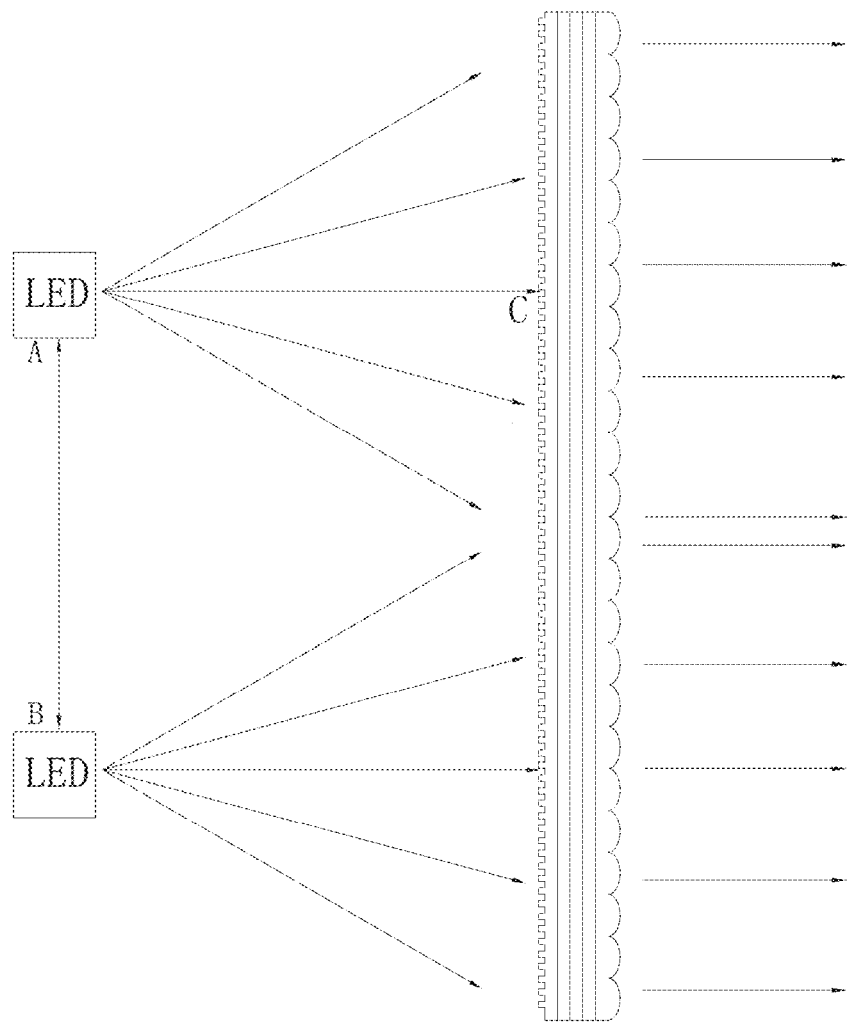
FIGS. 4A-4C show schematic views of light paths under different distances between the optical projection curtain and an LED display module in embodiment 1 of the invention.
Figure 4B:
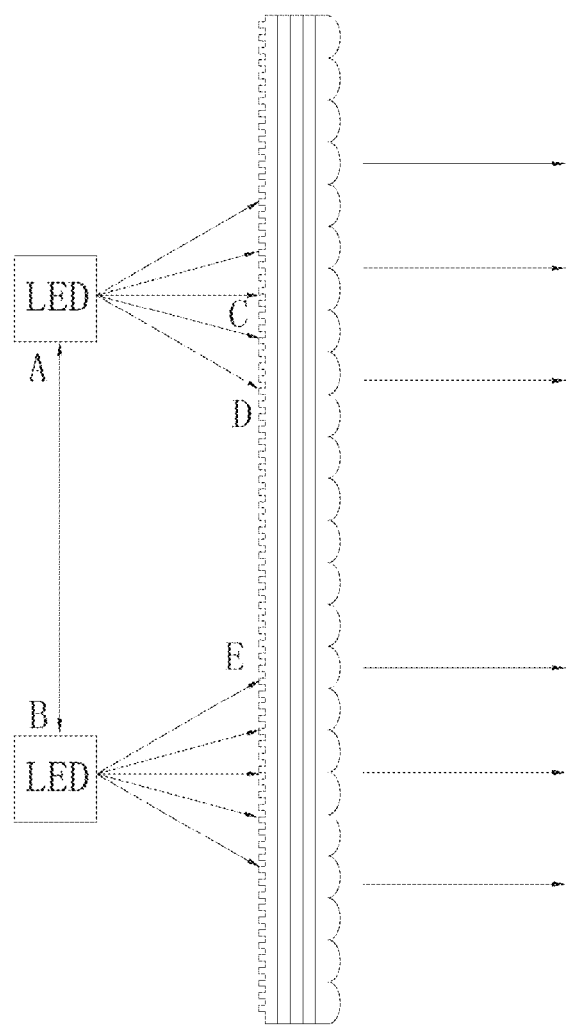
Figure 4C:
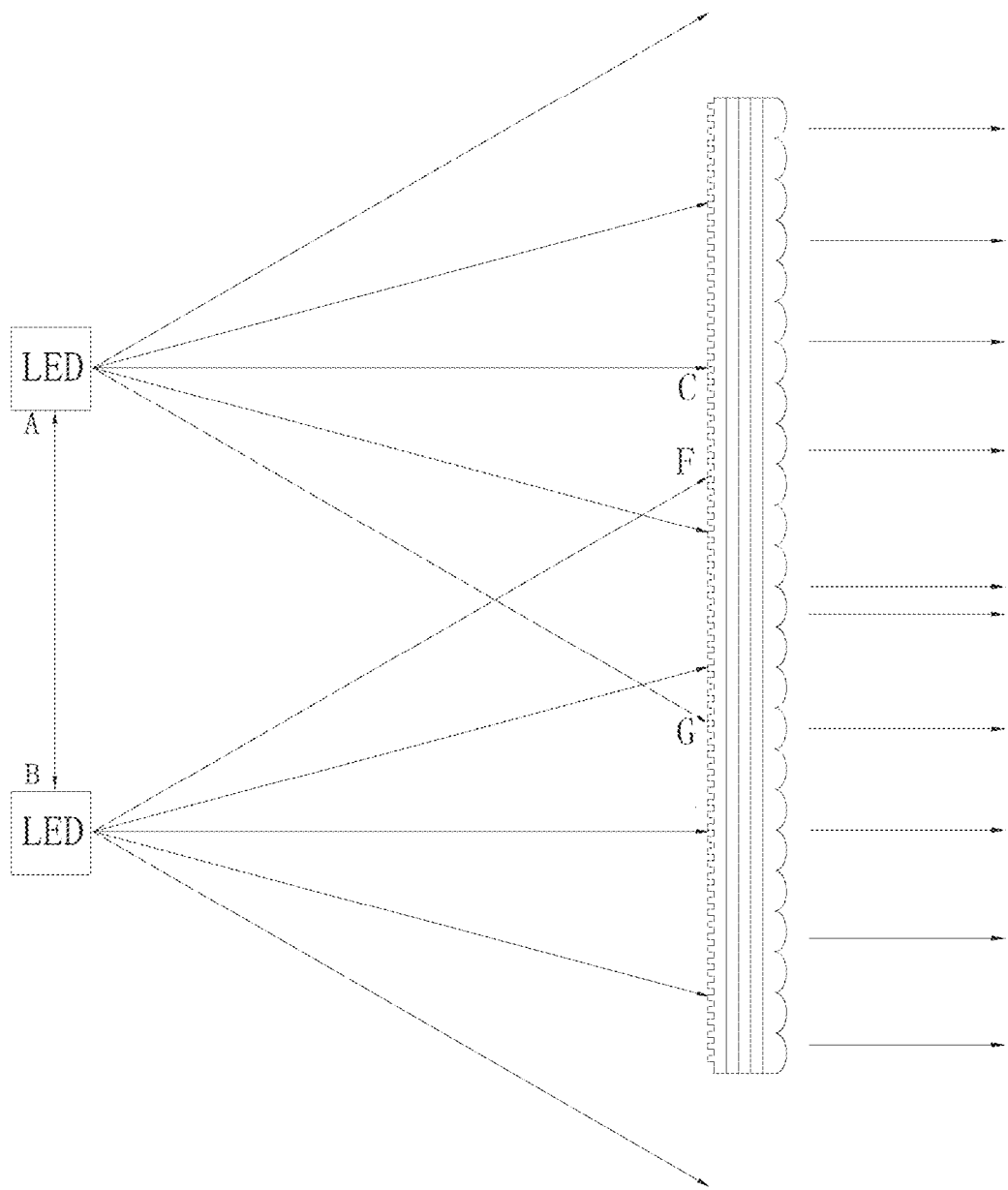

Identical with common LED display screens, the LED display module 1 is formed by LEDs arrayed at equal intervals, and the distances between every two LEDs are equal. In this embodiment, in order to optimize the display effect of the optical projection screen, the distance between the optical projection curtain 3 and the LED display module 1 is preferably set equal to the distance between two LEDs in the LED display module 1, as shown in FIGS. 4A-4C. FIG. 4A shows that the distance between the optical projection curtain 3 and the LED display module 1 is equal to the distance between two LEDs in the LED display module 1, and as can be seen from FIG. 4A, the maximum refraction angle of a grating structure layer 32 of the optical projection curtain 3 to projection lights is 60°, and when the distance AC between the LEDs and the optical projection curtain 3 is equal to the pixel pitch AB between the two LEDs, a gap between the two LED pixel points is exactly filled by the projection lights between the two LED pixel points, and thus, a picture will not have a grainy sense. FIG. 4B shows that the distance between the optical projection curtain 3 and the LED display module 1 is smaller than the distance between two LEDs in the LED display module 1, and as can be seen from FIG. 4B, when the distance AC between the LEDs and the optical projection curtain 3 is smaller than the pixel pitch AB between the two LEDs, the section DE of the gap between the two pixel points cannot be filled by the projection lights, and along with the increase of the difference between AC and AB, the grainy sense of the picture will become more and more obvious. FIG. 4C shows that the distance between the optical projection curtain 3 and the LED display module 1 is greater than the distance between two LEDs in the LED display module 1, and as can be seen from FIG. 4C, when the distance AC between the LEDs and the optical projection curtain 3 is greater than the pixel pitch AB between the two LEDs, the projection lights between the two pixel points overlap, the projection picture is fuzzy on the section FG, and along with the increase of the difference between AC and AB, the picture will become fuzzier and fuzzier. Thus, through the configuration in this embodiment, the optical projection screen acquires the optimal micro-pitch projection effect.

The optical UV glue 2 is a photo-cured UV adhesive. After lights emitted by the LED display module 1 penetrate through the optical UV glue 2, the light path is not refracted, the picture is not impaired, and the attributes, such as quality and color, of the picture are not affected. The optical UV glue 2 is a non-volatile and non-carcinogenic material.

The area of the optical projection curtain 3 is identical with the display area of the LED display module 1 so that multiple display modules can be spliced together to form a larger display screen, and packaging, transportation, installation and maintenance can be carried out conveniently.

Figure 1:
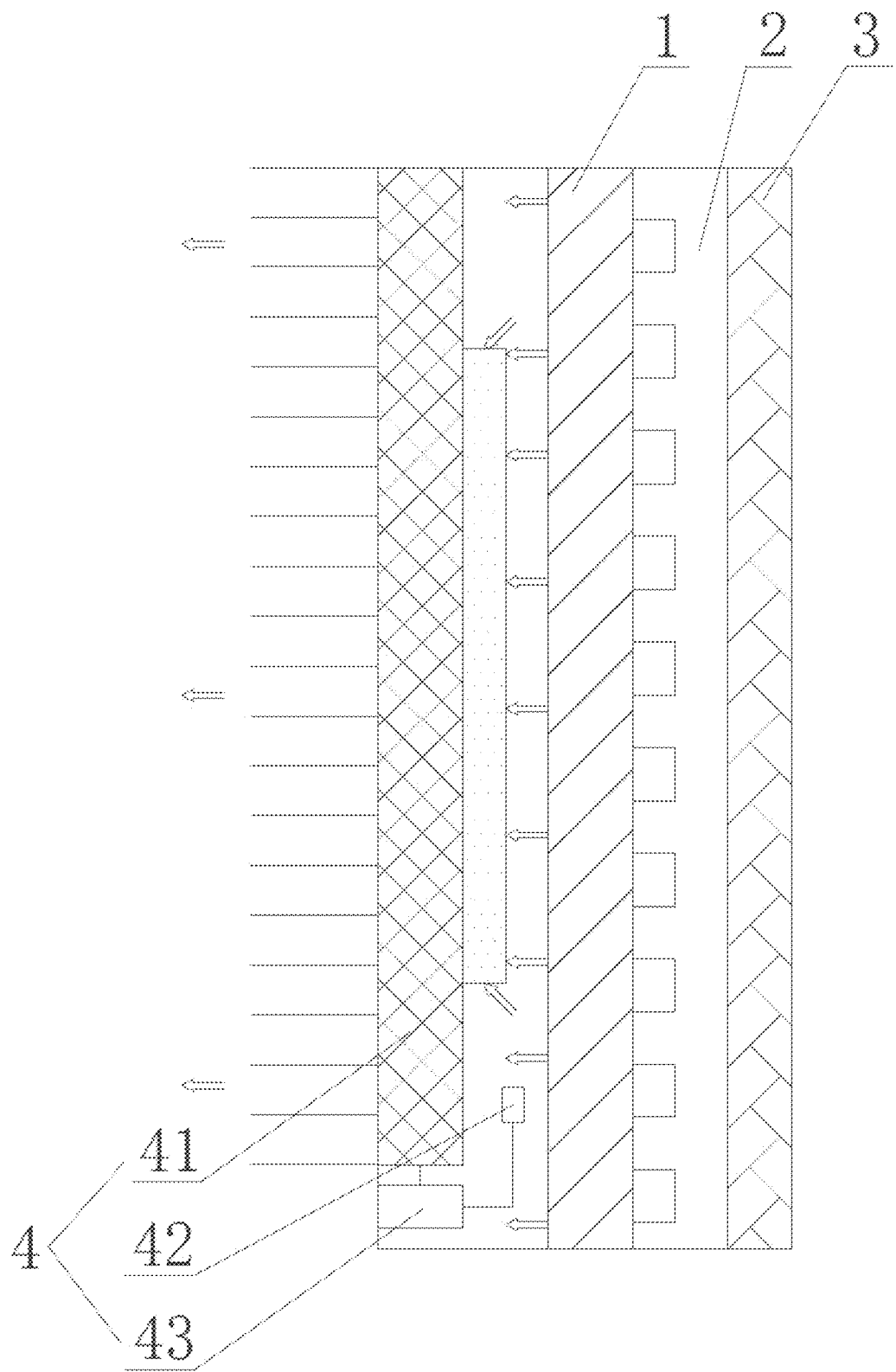
FIG. 1 is a structural view of a single cooling module in embodiment 1 of the invention.
Figure 2:
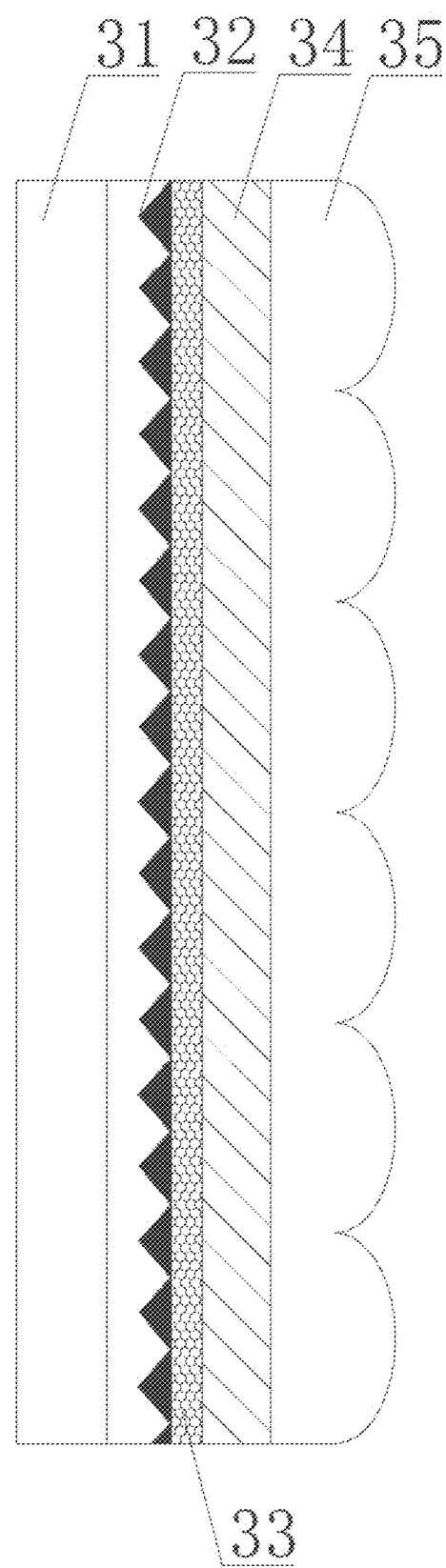
FIG. 2 is a structural view of an optical projection curtain in embodiment 1 of the invention.
Figure 3:
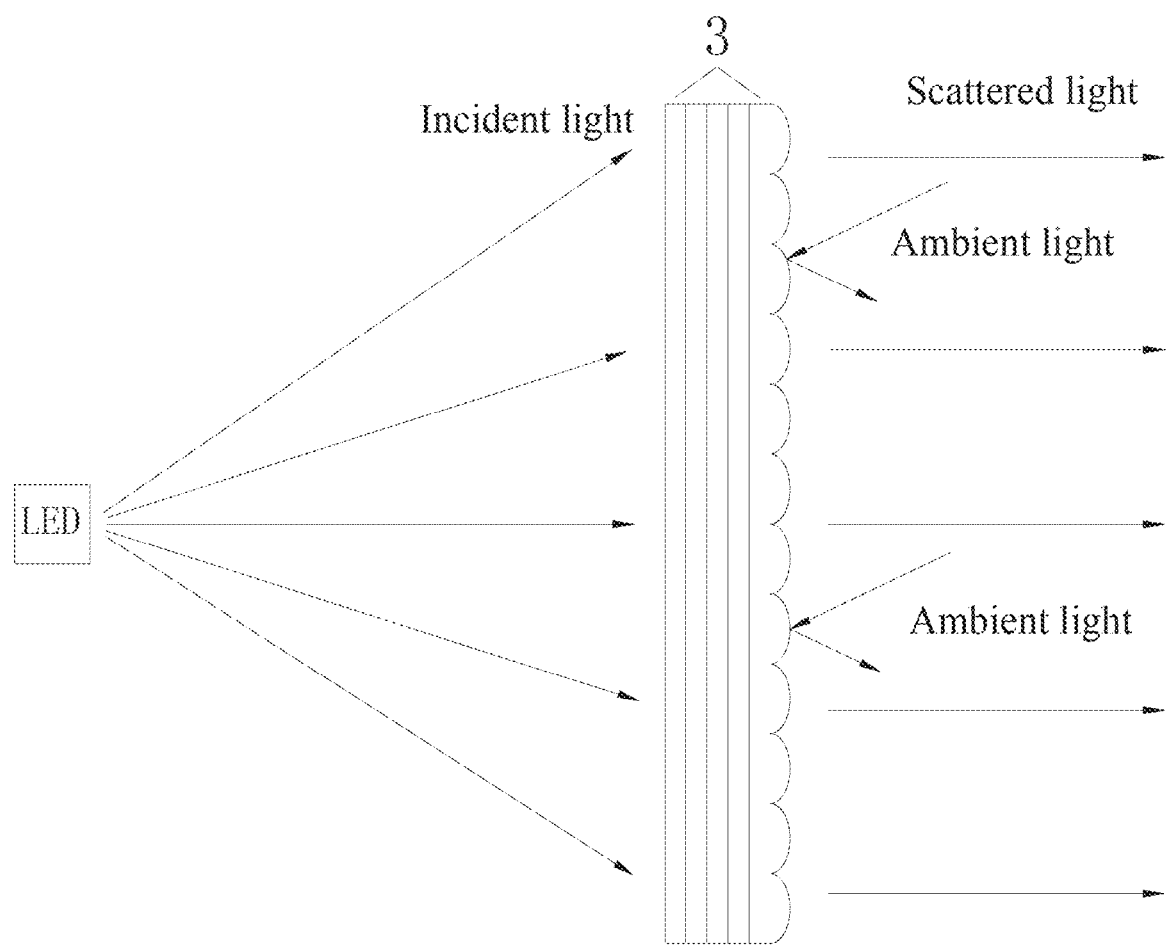
FIG. 3 is a schematic view of a light path in embodiment 1 of the invention.

As shown in FIG. 2, the optical projection curtain 3 is formed by a substrate 31, a grating structure layer 32, a dark particle coating 33, a light-scattering particle layer 34 and an exterior imaging layer 35 which are superposed in sequence.

The substrate 31 is a high-transmittance plate and can be supported by glass or plastic. In this embodiment, in order to ensure high tenacity and chemical stability of the substrate 31, the substrate 31 is preferably made from high-transmittance PVC materials.

The grating structure layer 32 is disposed on one side of the substrate 31. A plurality of grating units are disposed inside the grating structure layer 32 or on the surface of the grating structure layer 32. The grating units can be in an arc shape, an oval shape, a sawtooth shape or the like. In this embodiment, sawtooth-shaped grating units are disposed inside the grating structure layer 32 to adjust light paths, and after incident lights pass through the sawtooth-shaped grating units, the light paths tend to be in parallel.

The dark particle coating 33 is disposed on a side, away from the substrate 31, of the grating structure layer 32 and is configured by coating the grating structure layer 32 with black photosensitive factors. The dark particle coating 33 can reduce the light intensity and enhance the expression of the projection picture to extreme black. Those skilled in this field can change the light transmittance of the optical projection curtain 3 by adjusting the thickness of the dark particle coating 33, and then, the brightness of the optical projection screen is adjusted. In this embodiment, the dark particle coating 33 preferably has a thickness of 0.4-0.6 mm, and experimental results show that the dark particle coating 33 with such thickness can reduce the brightness of the optical projection screen by half.

The light-scattering particle layer 34 is disposed on a side, away from the grating structure layer 32, of the dark particle coating 33 and comprises a light-transmitting material and light-scattering particles disposed inside the light-transmitting material, wherein the light-transmitting material can be a high polymer material such as polystyrene or polymethyl methacrylate, the light-scattering particles can be made from polystyrene, polymethyl methacrylate or silicon dioxide and can interfere with lights to make the angle of a light beam tend to be 180°, and thus, the grainy sense of display of the LED display module 1 is eliminated. In addition, the light-scattering particle layer 34 further comprises a film filter disposed on the light-transmitting material and used to filter out a detrimental waveband. Based on the fact that common detrimental light is blue-light, the detrimental waveband preferably ranges from 400 nm to 450 nm in this embodiment, and the film filter can eliminate blue-light hazards of the LED display module 1. Those skilled in this field can also adopt film filters used for filtering out other detrimental wavebands.

The exterior imaging layer 35 is disposed on a side, away from the dark particle coating 33, of the light-scattering particle layer 34 and is made from a high-transmittance material such as a polymer PVC material. Diffuse reflection structures are disposed on a side, away from the light-scattering particle layer 34, of the exterior imaging layer 35, wherein the diffuse reflection structures can be regular or irregular protrusions. When shining on the diffuse reflection structures, outside lights such as lamplight will be subjected to diffuse reflection, and thus, an anti-glare effect of the screen is achieved.

In this embodiment, the optical projection curtain 3 can eliminate blue-light hazards of the LED display screen through micro-pitch optical projection, can reduce the brightness of a large screen into a range beneficial to the health of human eyes without impairing the grayscale and color of the picture, and can also eliminate the long-existing grainy sense of the pixels of the LED display screen to make the picture pixels softer and more consecutive.

The cooling module comprises a plurality of cooling assemblies 4 distributed in different areas and used to cool different areas of the LED display module 1. The cooling assemblies 4 can be randomly disposed at any positions and can also be arrayed according to a certain rule. In this embodiment, the cooling assemblies 4 are preferably arrayed in a matrix manner, and the areas, corresponding to the cooling assemblies 4, of the LED display module 1 are identical in size.

Each cooling assembly 4 comprises a semiconductor refrigeration module 41, a temperature sensor 42 and an intelligent switch 43. The intelligent switches 43 are electrically connected with the temperature sensors 42 and the semiconductor refrigeration modules 41. The semiconductor refrigeration modules 41 are used for cooling the LED display module 1. The temperature sensors 42 are used for detecting the temperature of the LED display module 1. The intelligent switches 43 are used for controlling on-off of the semiconductor refrigeration modules 41 according to the temperature detected by the temperature sensors 42.

The semiconductor refrigeration modules 41 are based on the semiconductor refrigeration principle. A hollow area is formed between each semiconductor refrigeration module 41 and the LED display module 1. The temperature sensors 42 are disposed in the hollow areas.

As for a large screen formed by a plurality of LED display modules 1 spliced together, the quantities of heat generated by the modules are different due to inconsistent hues of contents displayed in different areas; however, through the above feedback adjustment mechanism, the operating temperatures of the LED display modules 1 can be accurately controlled in real time to be in a relatively-balanced state all the time, and thus, the occurrence rate of dead pixels of the LED display modules 1 is greatly decreased.

In this embodiment, in order to monitor the temperature of the optical projection screen, each intelligent switch 43 preferably comprises a control unit 431 and a first data transmission unit 432. The control units 431 are electrically connected with the temperature sensors 42, the semiconductor refrigeration modules 41 and the first data transmission units 432. The temperature sensors 42 transmit acquired temperature data to the control units 431, and the control units 431 control on-off of the semiconductor refrigeration modules 41 according to the temperature and transmit or receive data via the first data transmission units 432.

The first data transmission units 432 can be wired transmission units such as serial ports or USBs, or can be wireless transmission units such as RF wireless transmission and reception modules. In this embodiment, in order to achieve remote control, the first data transmission units 432 are preferably wireless transmission units.

Experimental results of embodiment 1 of the invention:

With an LED display module 1 having a pixel pitch of P1.667 as test media, when the LED display module 1 works under a full-power condition, a white picture displayed by the LED display module 1 has a typical brightness value of 900 cd/$M^2$; and after the white picture passes through the optical projection curtain 3, the brightness value of the white picture turns to 405 cd/$M^2$ which is within the range beneficial to human health.

With the LED display module 1 having a pixel pitch of P1.667 as test media, two modules are separately tested under the same environment of 27° C., wherein the first module adopts a typical passive cooling method, while the second module adopts the active cooling method mentioned in the invention, and the same grayscale picture is separately displayed by the two modules. Five hours later, the temperature of a high-brightness part of the first module is 41.3° C., the temperature of a low-brightness part of the first module is 29.8° C., while the temperatures of a high-brightness part and a low-brightness part of the second module are both 28.7° C.; and both the temperature of the first module and the temperature of the second module are maintained within a very small deviation range. After operating for 720 hours, the first module has three dead pixels on the high-brightness part and has no dead pixel on the low-brightness part, while the second module has no dead pixel on the high-brightness part and has no dead pixel on the low-brightness part either.

At the same time, in another laboratory, with the LED display module 1 having a pixel pitch of P1.667 as test media, two modules are separately tested under the same environment of 27° C., wherein the first module adopts a typical passive cooling method, while the second module adopts the active cooling method mentioned in the invention, the same grayscale picture is separately displayed by the two modules, and the high brightness and the low brightness of the grayscale are set to automatically alternate every 10 minutes. Five hours later, the temperature of the first module fluctuates along with changes of the grayscale of the picture, while the temperature of the second module is always kept at 28.5° C. and fluctuates within an extremely small range. After opening for 720 hours, the first module has five dead pixels, while the second module has no dead pixel.

As can be seen from the experimental data, the higher the operating temperature of the LED display module 1, the large the temperature change, and the higher the occurrence rate of dead pixels. When the operating temperature of the LED display module 1 is lower than 30° C. and kept stable, the occurrence rate of dead pixels is greatly decreased.

In the first embodiment of the invention, the operating temperatures of all spliced modules of a large screen can be kept balanced by independently controlling the temperatures in all areas of the LED display modules 1, and accordingly, the occurrence rate of dead pixels is greatly decreased; blue-light hazards of the LED display screens are eliminated through micro-pitch optical projection, the brightness of the large screen can be reduced into a range beneficial to human health without impairing the grayscale and color of pictures, the long-existing grainy sense of pixels of the LED display screens is eliminated, and the picture pixels are soft and consecutive; and the optical projection screen is compatible with LED display modules 1 with various pixel specifications, and required large screen with any sizes can be obtained by splicing multiple LED display modules together.

Embodiment 2

Figure 5:
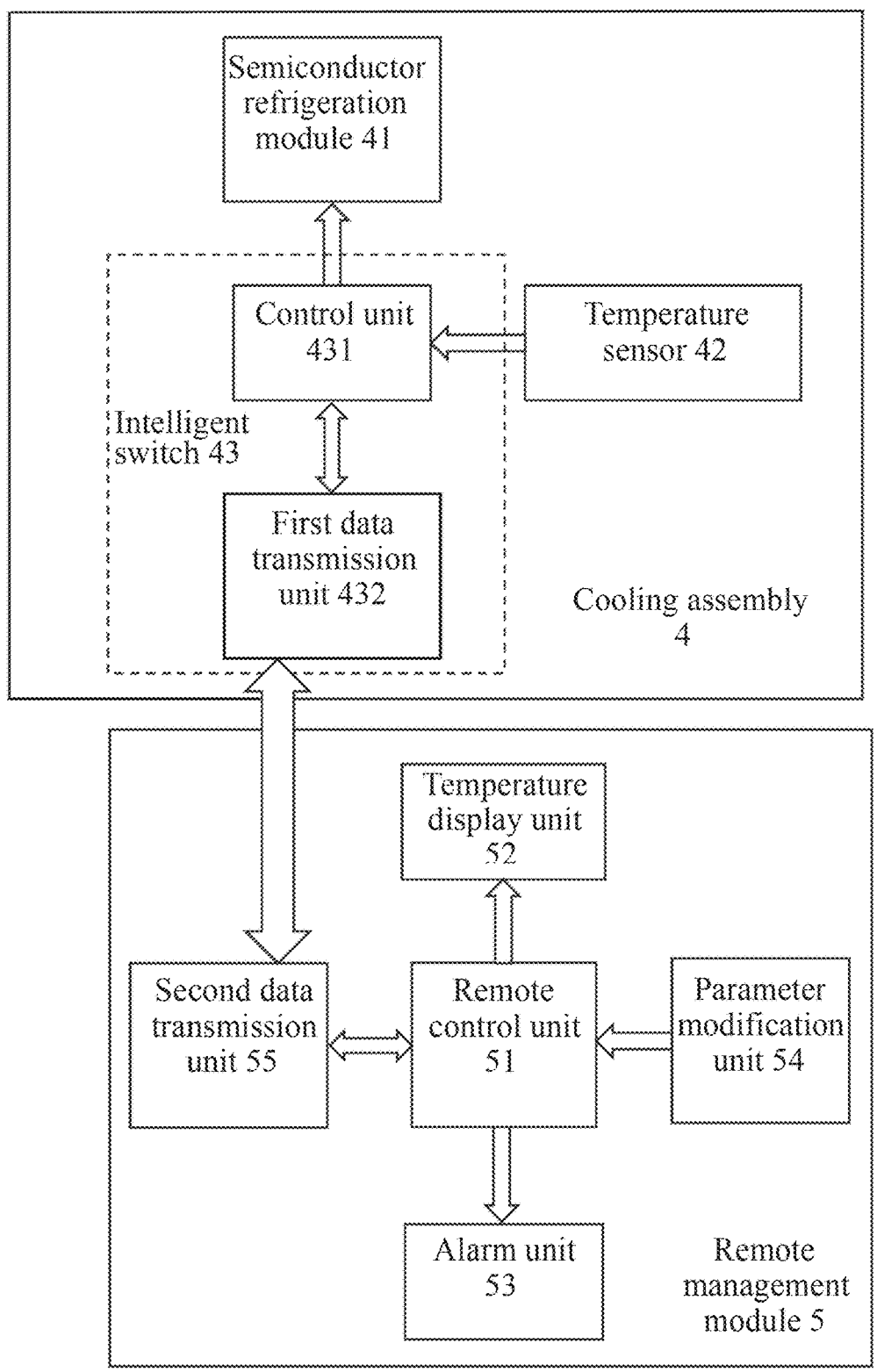
FIG. 5 is an electrical-connection schematic view of embodiment 2 of the invention.
Figure 6:
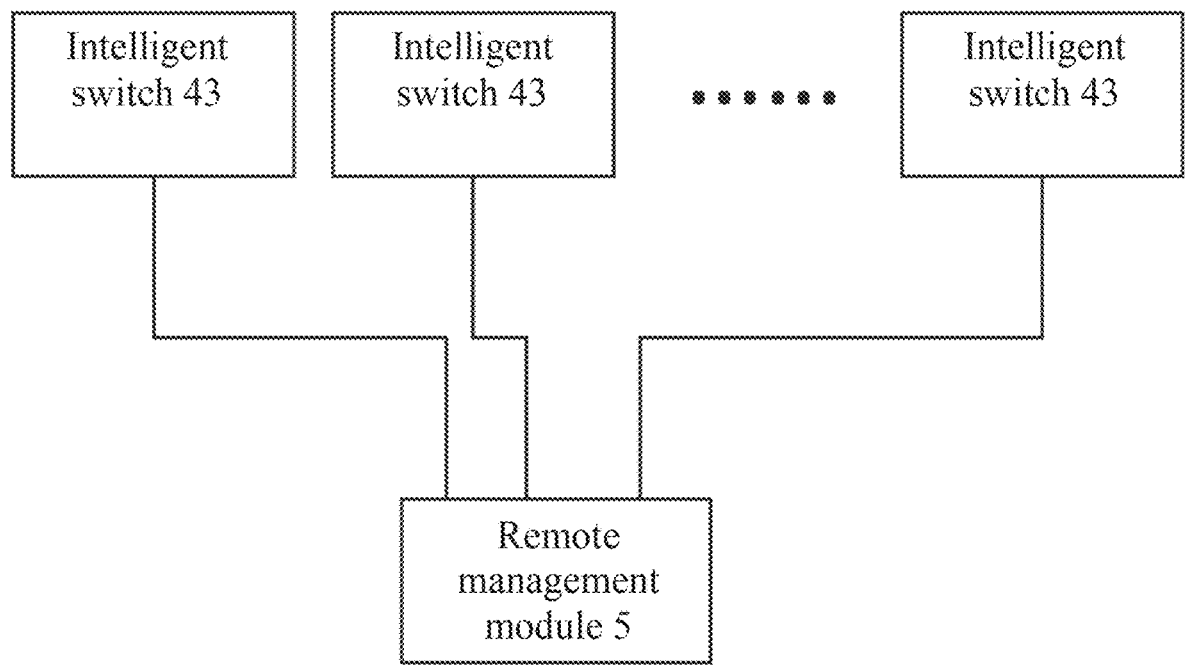
FIG. 6 is another electrical-connection schematic view of embodiment 2 of the invention.
Figure 7:
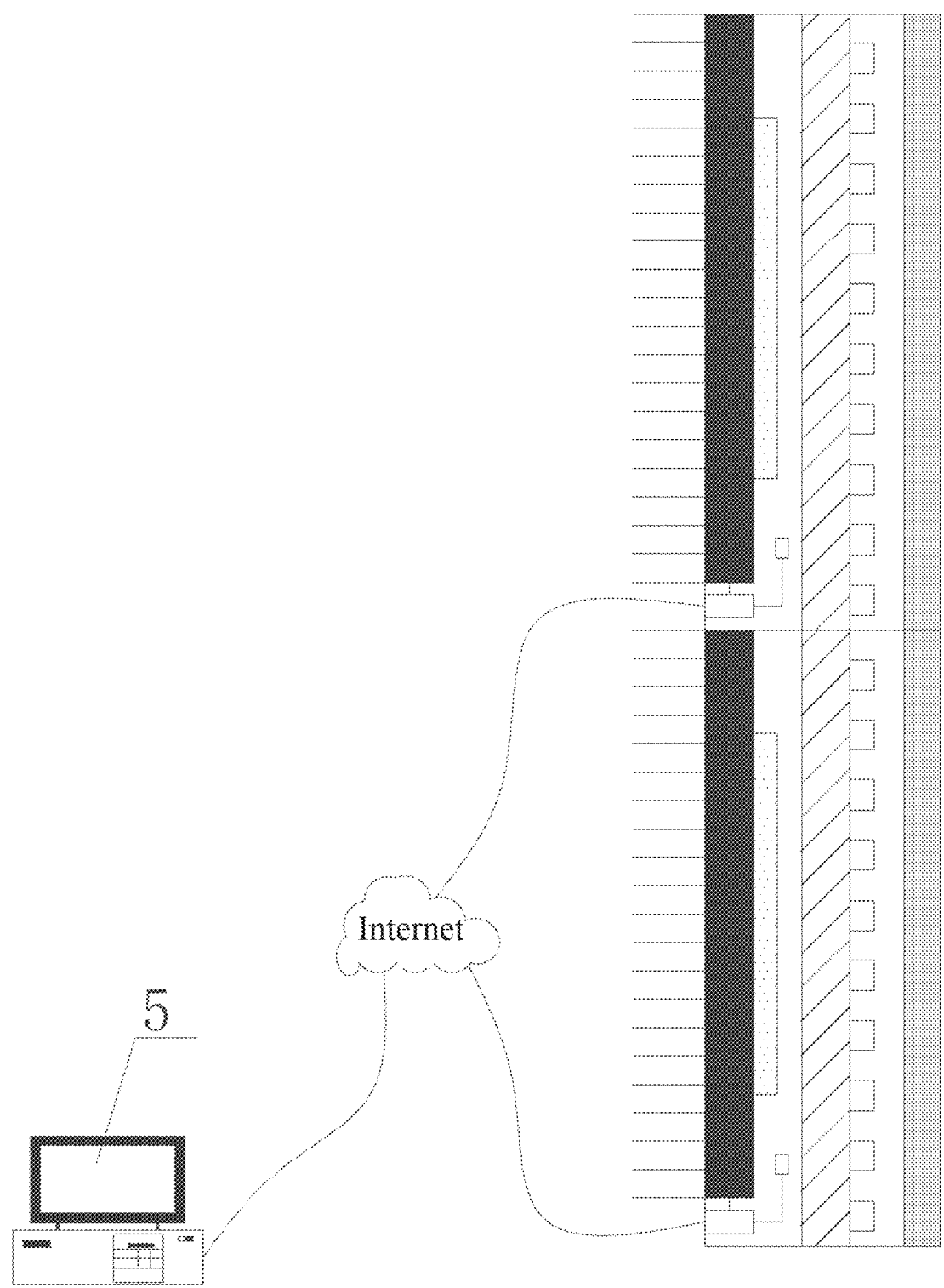
FIG. 7 is an overall structural view of embodiment 2 of the invention.

As shown in FIGS. 5-7, the second embodiment of the invention provides an optical projection screen management system. On the basis of the optical projection screen in the first embodiment, the optical projection screen management system further comprises a remote management module 5. The remote management module 5 comprises a remote control unit 51, a temperature display unit 52, an alarm unit 53, a parameter modification unit 54 and a second data transmission unit 55. The remote control unit 51 is electrically connected with the temperature display unit 52, the alarm unit 53, the parameter modification unit 54 and the second data transmission unit 55. The remote control unit 51 receives temperature data via the second data transmission unit 55, makes a judgment on the temperature data after receiving the temperature data, transmits the temperature data to the temperature display unit 52 for displaying at the same time, and outputs an alarm signal to the alarm unit 53 when the temperature data are greater than a temperature threshold. After receiving the alarm signal, the alarm unit 53 sends out an alarm prompt. The parameter modification unit 54 receives temperature threshold data input by users and then sends the temperature threshold data to the remote control unit 51. The remote control unit 51 transmits the temperature threshold data to the control units 431 of all the intelligent switches 43 via the second data transmission unit 55. The control units 431 modify the temperature threshold according to the received temperature threshold data.

The alarm unit 53 can give an alarm in a common alarm form such as voice prompt or visual prompt.

The temperature display unit 52 comprises display blocks which are identical with the cooling assemblies 4 in number and are in one-to-one correspondence with the cooling assemblies 4 in position. Each display block displays the temperature data transmitted to the remote control unit 51 by the intelligent switch 43 in the corresponding cooling assembly 4. In this embodiment, in order to facilitate observation of abnormal temperature data by personnel, temperature data greater than the temperature threshold are preferably highlighted with respect to other temperature data in a different color or font or in other manners.

Identical with the first data transmission units 432, the second data transmission unit 55 can be a wired transmission unit such as a serial port and a USB, or a wireless transmission unit such as a RF wireless transmission and reception module. In this embodiment, in order to achieve remote control, the second data transmission unit 55 is preferably a wireless transmission unit, and data transmission between the second data transmission unit 55 and the first data transmission units 432 is carried out via wireless networks.

In this embodiment, users can observe the temperatures of corresponding areas in the optical projection screen through the temperature display unit 52 in the remote management module 5 and can be reminded when the temperatures are too high. Temperature thresholds can be set according to requirements, so that centralized monitoring, remote control and fault alarm of the optical projection screen are achieved, and background operators can manage a large screen very conveniently.

Although the invention is specifically illustrated and introduced with reference to preferred embodiments, those skilled in this field would appreciate that various modifications of the invention can be made in form and in detail without deviating from the spirit and scope defined by the claims, and all these modifications should fall within the protection scope of the invention.

What is claimed is:

1. An optical projection screen, comprising an LED display module, a cooling module and an optical projection curtain, wherein the optical projection curtain adheres to the LED display module with optical UV glue and is disposed on a light-emitting side of the LED display module, and the cooling module is fixedly disposed on a backlight side of the LED display module;

the cooling module comprises a plurality of cooling assemblies which are distributed in different areas and are respectively used for cooling different areas of the LED display module; each said cooling assembly comprises a semiconductor refrigeration module, a temperature sensor and an intelligent switch; the intelligent switches are electrically connected with the temperature sensors and the semiconductor refrigeration modules, the semiconductor refrigeration modules are used for cooling the LED display module, the temperature sensors are used for detecting a temperature of the LED display module, and the intelligent switches control on-off of the semiconductor refrigeration modules according to the temperature detected by the temperature sensors;

the optical projection curtain is formed by a substrate, a grating structure layer, a dark particle coating, a light-scattering particle layer and an exterior imaging layer which are superposed in sequence, wherein the substrate is a high-transmittance plate, the grating structure layer comprises a plurality of grating units, the dark particle coating is formed by coating the grating structure layer with black photosensitive factors and comprises a light-transmitting material, light-scattering particles disposed inside the light-transmitting material and a film filter disposed on the light-transmitting material and used to filter out a detrimental waveband, and diffuse reflection structures are disposed on a side, away from the dark particle coating, of the exterior imaging layer.

2. The optical projection screen according to claim 1, wherein the LED display module is formed by LEDs arrayed at equal intervals, distances between every two said LEDs are equal, and a distance between the optical projection curtain and the LED display module is equal to the distance between two said LEDs in the LED display module.

3. The optical projection screen according to claim 1, wherein the dark particle coating has a thickness of 0.4-0.6 mm.

4. The optical projection screen according to claim 1, wherein the cooling assemblies are arrayed in a matrix manner.

5. The optical projection screen according to claim 1, wherein the detrimental waveband ranges from 400 nm to 450 nm.

6. The optical projection screen according to claim 1, wherein each said grating unit is in a sawtooth shape.

7. The optical projection screen according to claim 1, wherein each said intelligent switch comprises a control unit and a first data transmission unit, the control units are electrically connected with the temperature sensors, the semiconductor refrigeration modules and the first data transmission units, the temperature sensors transmit acquired temperature data to the control units, and the control units control on-off of the semiconductor refrigeration modules according to the temperature and transmit or receive data via the first data transmission units.

8. An optical projection screen management system, being based on the optical projection screen according to claim 7, further comprising a remote management module, wherein the remote management module comprises a remote control unit, a temperature display unit, an alarm unit, a parameter modification unit and a second data transmission unit, the remote control unit is electrically connected with the temperature display unit, the alarm unit, the parameter modification unit and the second data transmission unit, the remote control unit receives temperature data via the second data transmission unit, makes a judgment on the temperature data after receiving the temperature data, transmits the temperature data to the temperature display unit for displaying at the same time, and outputs an alarm signal to the alarm unit when the temperature data are greater than a temperature threshold, the alarm unit sends out an alarm prompt after receiving the alarm signal, the parameter modification unit receives temperature threshold data input by users and then transmits the temperature threshold data to the remote control unit, the remote control unit transmits the temperature threshold data to the control units of all the intelligent switches via the second data transmission unit, and the control units modify a temperature threshold according to the received temperature threshold data.

9. An optical projection screen management system according to claim 8, wherein the temperature display unit comprises display blocks in one-to-one correspondence with the cooling assemblies in position, and each said display block displays temperature data transmitted to the remote control unit by the intelligent switch in the corresponding cooling assembly.

* * * * *